US009692379B2

(12) United States Patent
Jiang et al.

(10) Patent No.: US 9,692,379 B2
(45) Date of Patent: Jun. 27, 2017

(54) ADAPTIVE AUDIO CAPTURING

(71) Applicant: Spreadtrum Communications (Shanghai) Co., Ltd., Pudong New Area, Shanghai (CN)

(72) Inventors: Bin Jiang, Shanghai (CN); Sheng Wu, Shanghai (CN); Fuhuei Lin, Shanghei (CN); Jingming Xu, Shanghai (CN)

(73) Assignee: SPREADTRUM COMMUNICATIONS (SHANGHAI) CO., LTD., Pudong New Area, Shanghai (CN)

( * ) Notice: Subject to any disclaimer, the term of this patent is extended or adjusted under 35 U.S.C. 154(b) by 0 days.

(21) Appl. No.: 14/758,026

(22) PCT Filed: Dec. 31, 2012

(86) PCT No.: PCT/CN2012/087963
§ 371 (c)(1),
(2) Date: Jun. 26, 2015

(87) PCT Pub. No.: WO2014/101156
PCT Pub. Date: Jul. 3, 2014

(65) Prior Publication Data
US 2015/0341006 A1 Nov. 26, 2015

(51) Int. Cl.
*H03G 3/00* (2006.01)
*H03G 3/20* (2006.01)
(Continued)

(52) U.S. Cl.
CPC .............. *H03G 3/20* (2013.01); *H04R 3/005* (2013.01); *G10L 25/78* (2013.01); *G10L 2021/02165* (2013.01); *H04R 2499/11* (2013.01)

(58) Field of Classification Search
CPC ...... H03G 3/20; H04R 3/005; H04R 2499/11; G10L 25/78; G10L 2021/02165
(Continued)

(56) References Cited

U.S. PATENT DOCUMENTS 4,241,329 A * 12/1980 Bahler .................... G10L 15/00
704/231
6,125,288 A * 9/2000 Imai ........................ H03G 3/32
379/388.04
(Continued)

FOREIGN PATENT DOCUMENTS

| CN | 1732872 A | 2/2006 |
| CN | 1794758 A | 6/2006 |
| CN | 101595452 A | 12/2009 |

OTHER PUBLICATIONS

International Search Report corresponding to Application No. PCT/CN2012/087963; Date of Mailing: Oct. 10, 2013.

*Primary Examiner* — Vivian Chin
*Assistant Examiner* — Con P Tran
(74) *Attorney, Agent, or Firm* — Cantor Colburn LLP

(57) ABSTRACT

Embodiments of the present invention relate to adaptive audio capturing. A method for adaptive audio capturing is disclosed. The method comprising obtaining an audio signal through an audio channel associated with an audio capturing element on a user terminal; calculating a signal amplitude for the audio channel by processing the obtained audio signal; and determining a functionality of the audio capturing element based on the signal amplitude and a further signal amplitude for at least one further audio channel associated with at least one further audio capturing element on the user terminal. Corresponding apparatus, computer program product, and user terminal are also disclosed.

12 Claims, 4 Drawing Sheets

(51) Int. Cl.
*H04R 3/00* (2006.01)
*G10L 21/0216* (2013.01)
*G10L 25/78* (2013.01)

(58) Field of Classification Search
USPC ..... 381/107, 122, 91, 92, 123, 104, 56, 110, 381/111; 455/79, 78, 73
See application file for complete search history.

(56) References Cited

U.S. PATENT DOCUMENTS

| | | | |
|---|---|---|---|
| 2010/0081487 A1* | 4/2010 | Chen | G10L 21/0208 455/575.1 |
| 2012/0051548 A1* | 3/2012 | Visser | G10L 21/0208 381/56 |
| 2013/0344788 A1* | 12/2013 | Buch | B60H 1/00742 454/75 |

* cited by examiner

ADAPTIVE AUDIO CAPTURING

The present application is a National Stage Application of International Application No. PCT/CN2012/087963, filed on Dec. 31, 2012, and entitled "ADAPTIVE AUDIO CAPTURING", the entire disclosure of which is incorporated herein by reference.

TECHNICAL FIELD

Embodiments of the present invention generally relate to audio processing, and more particularly, to a method, apparatus, computer program, and user terminal for adaptive audio capturing.

BACKGROUND

A user terminal like a mobile phone, a tablet computer or a personal digital assistant (PDA) may have a plurality of audio capturing elements such as multiple microphones. Such configuration has become popular in past several years. For example, those commercially available smart mobile phones are usually equipped with two or more microphones. Generally speaking, among the plurality of audio capturing elements on a single user terminal, some of them are designed to function as primary audio capturing elements and used to capture, for example, the foreground audio signals; while the audio capturing elements may function as reference or auxiliary ones and used to capture, for example, the background audio signals. As an example, a microphone located in the lower part of a mobile phone is generally supposed to be capable of capturing high quality of voice signals from a speaker. Therefore, this microphone is usually used as a primary audio capturing element to capture the user's speech signal in a voice call. A microphone at another location may function as an auxiliary audio capturing element that may be used to capture the background noise for environmental noise estimation, noise inhibition, and the like.

Those skilled in the art would appreciate that the spatial location of a user terminal with respect to the audio signal source and the surrounding environment will have an impact on the effects of audio capturing. For example, in some situations, the originally designed primary audio capturing element might be blocked or located opposite to the audio signal source of the user terminal, thereby rendering the originally designed primary audio capturing element incapable of capturing audio signals of high quality. However, in the prior art, an auxiliary or reference audio capturing element cannot be activated to function as a primary one in this situation, even if this element is now in a better or optimal position. In other words, the functionalities of audio capturing elements on the user terminal are fixed in design and manufacturing, and cannot be changed or switched adaptively in use. As a result, the quality of audio capturing will degrade.

In view of the foregoing, there is a need in the art for an audio capturing solution that may be adaptive to various conditions in use.

SUMMARY

In order to address the foregoing and other potential problems, embodiments of the present invention propose a method, apparatus, computer program, and user terminal for adaptive audio capturing.

In one aspect, embodiments of the present invention provide a method for adaptive audio capturing. The method comprising: obtaining an audio signal through an audio channel associated with an audio capturing element on a user terminal; calculating a signal amplitude for the audio channel by processing the obtained audio signal; and determining a functionality of the audio capturing element based on the signal amplitude and a further signal amplitude for at least one further audio channel associated with at least one further audio capturing element on the user terminal. Other embodiments in this aspect include a corresponding computer program product.

In another aspect, embodiments of the present invention provide an apparatus for adaptive audio capturing. The apparatus comprising: an obtaining unit configured to obtain an audio signal through an audio channel associated with an audio capturing element on a user terminal; a calculating unit configured to calculate a signal amplitude for the audio channel by processing the obtained audio signal; and a determining unit configured to determine a functionality of the audio capturing element based on the signal amplitude and a further signal amplitude for at least one further audio channel associated with at least one further audio capturing element on the user terminal.

In yet another aspect, embodiments of the present invention provide a user terminal. The user terminal comprises at least one processor; a plurality of audio capturing elements; and at least one memory coupled to the at least one processor and storing program of computer executable instructions, the computer executable instructions configured, with the at least one processor, to cause the mobile terminal to at least perform according to the method outlined in the above paragraphs.

These and other optional embodiments of the present invention can be implemented to realize one or more of the following advantages. For a user terminal equipped with a plurality of audio capturing elements, by processing and analyzing the audio signals in real time, the functionalities of the multiple audio capturing elements on a single user terminal may be dynamically determined and changed. For example, according to the various factor like the relative position of the user terminal with respect to the audio signal source and/or the gesture of the user terminal itself, the most optimal audio capturing element may be adaptively determined as the primary element, while one or more other audio capturing elements may function as reference audio capturing elements accordingly. In this way, the quality of captured audio signals may be maintained at a high level in various conditions in use.

Other features and advantages of embodiments of the present invention will also be understood from the following description of exemplary embodiments when read in conjunction with the accompanying drawings, which illustrate, by way of example, sprite and principles of the present invention.

BRIEF DESCRIPTION OF THE DRAWINGS

The details of one or more embodiments of the present invention are set forth in the accompanying drawings and the description below. Other features, aspects, and advantages of the invention will become apparent from the description, the drawings, and the claims, wherein:

Throughout the drawings, same or similar reference numbers indicates same or similar elements.

DETAILED DESCRIPTION

In general, embodiments of the present invention provide a method, apparatus, and computer program product for adaptive audio capturing. In accordance with embodiments of the present invention, for a user terminal equipped with a plurality of audio capturing elements, by processing and analyzing the audio signals in real time, the functionalities of the multiple audio capturing elements on a single user terminal may be dynamically determined and changed. As such the quality of captured audio signals may be maintained at a high level in various conditions in use.

Figure 1:
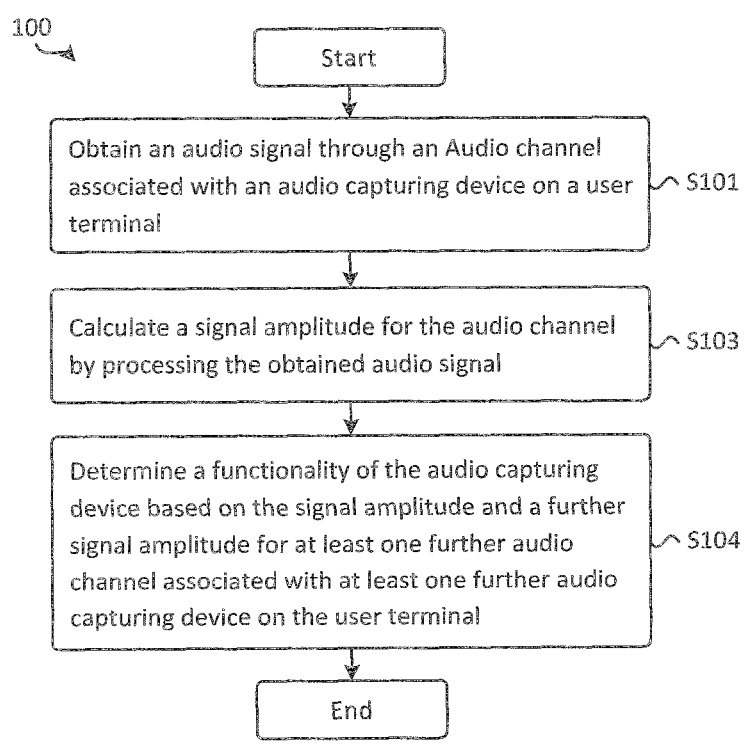
FIG. 1 is a flowchart illustrating a method for adaptive audio capturing in accordance with an exemplary embodiment of the present invention.

Reference is first made to FIG. 1, where a flowchart illustrating a method 100 for adaptive audio capturing in accordance with an exemplary embodiment of the present invention is shown. As shown, after method 100 starts, an audio signal is obtained at step S101 through an audio channel associated with an audio capturing element on a user terminal. In accordance with embodiments of the present invention, the user terminal is equipped with a plurality of audio capturing elements. As used herein, the term "audio capturing element" refers to any suitable device that may be configured to capture, record, or otherwise obtain audio signals, such as microphones. Each audio capturing element is associated with an audio channel through which the audio signals captured by that audio capturing element may be passed to, for example, the processor or controller of the user terminal.

Method 100 then proceeds to step S103 where the signal amplitude for the audio channel is calculated by processing the obtained audio signal. In accordance with embodiments of the present invention, the signal amplitude for the audio channel may comprise any information indicating the magnitude of the audio signals on that channel. In some exemplary embodiments, the single amplitude calculated at step S103 may comprise the signal magnitude in time domain, which may be expressed by the root mean square value of the audio signal, for example. Alternatively or additionally, the amplitude in frequency domain like the spectrum amplitude and/or power spectrum of the obtained audio signal may also be used as the signal amplitude. It will be appreciated that these are only some examples of signal amplitude and should not be constructed as a limit of the present invention. Any information capable of indicating the signal amplitude for an audio channel, whether currently known or developed in the future, may be used in connection with embodiments of the present invention. Specific examples in this regard will be detailed below with reference to FIG. 2.

Furthermore, in some situation like a voice call, the location of audio signal source (e.g., a speaker) with respect to the audio capturing elements on the user terminal will generally remain stable at least in a certain period of time. Therefore, in some exemplary embodiments, the signal amplitude calculated at step S103 may comprise an average of the single amplitudes accumulated over a given time interval. In these embodiments, the average signal amplitudes may be used to determine the functionality of audio capturing elements for a next time interval, for example. Specific examples in this regard will be detailed below with reference to FIG. 2.

Next, at step S104, a functionality of the audio capturing element is determined based on the signal amplitude and a further signal amplitude for at least one further audio channel associated with at least one further audio capturing element on the user terminal. As described above, in addition to the audio channel which is considered at steps S101 and S103, the user terminal is equipped with one or more other audio capturing elements, each of which is associated with a corresponding audio channel. The signal amplitudes for one or more of these audio channels may be calculated in a similar way as described above. In accordance with embodiments of the present invention, the signal amplitude for another audio channel may be calculated by method 100 or by a similar process associated with or dedicated to that audio channel.

The functionality of the audio capturing element may be determined based on the signal amplitude for the associated audio channel and the further signal amplitudes for one or more further audio channels on the same user terminal. Generally speaking, if the audio channel is of higher signal amplitude, the associated audio capturing element may be used as a primary element and configured to, for example, capture the foreground audio signals (e.g., the user's speech signal in a voice call). To the contrary, if the audio channel is of lower signal amplitude, the associated audio capturing element may be used as an auxiliary or reference audio capturing element and configured to capture background audio signals for the purpose of noise estimation, for example.

Method 100 ends after step S104. By using method 100, the functionalities of multiple audio capturing elements may be determined adaptively according to the specific condition in real time. For example, assuming that a mobile phone has two microphones, one of which is a primary one for capturing the user's speech signal while the other is an auxiliary one for capturing background noise. In case that the original primary microphone is blocked by an object and therefore the signal magnitude on the associated audio channel degrades to a level below the signal magnitude of the audio channel associated with the original auxiliary microphone, then the functionalities of these two microphones can be swapped accordingly. That is, the original auxiliary element is now changed to function as the primary audio capturing element, while the original primary audio capturing element may be changed to function as the auxiliary one or directly disabled.

Figure 2:
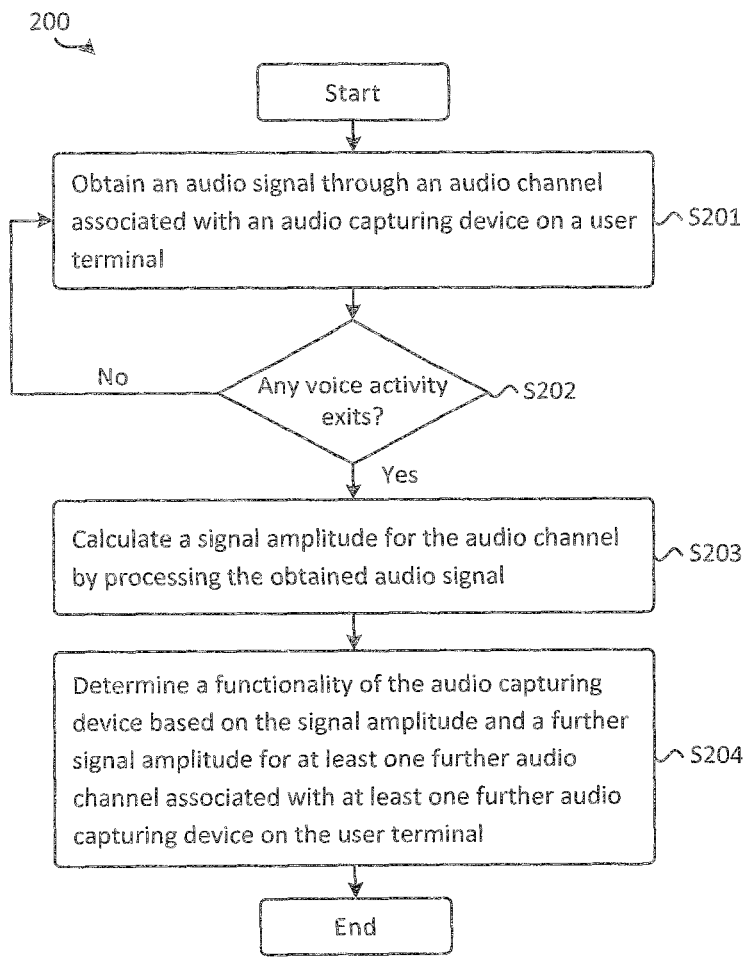
FIG. 2 is a flowchart illustrating a method for adaptive audio capturing in accordance with another exemplary embodiment of the present invention.

Now a more specific example will be described with reference to FIG. 2, which shows a flowchart illustrating a method 200 for adaptive audio capturing in accordance with another exemplary embodiment of the present invention.

After method 200 starts, an audio signal is obtained at step S201 through an audio channel associated with an audio capturing element on a user terminal. Assuming that a user terminal comprises a plurality of microphones as audio capturing elements, the audio signal may be obtained from an audio channel associated with one of the microphones. Step S201 corresponds to step S101 described above with reference to FIG. 1 and will not detailed here.

Next, method 200 proceeds to step S202 where the voice activity detection (VAD) is performed to determine whether there is a voice activity on one or more audio channels of the user terminal. If not, method 200 returns to step S201. In other words, according to the embodiments shown in FIG. 2, the subsequent steps are performed only if a voice activity exists. This is primarily due to the concerns of energy saving. That is, if there is no voice activity on the audio channel(s) of the user terminal, then it is unnecessary to calculate the signal amplitude and determine or change the functionalities of the audio capturing element. In this way, the user terminal may operate more effectively.

In accordance with embodiments of the present invention, various strategies may be utilized to implement the voice activity detection. In some exemplary embodiments, the voice activity detection may be performed only on a single audio channel. For example, the voice activity detection may be performed on the audio channel which is associated with the current primary audio capturing element on the user terminal. Alternatively, the voice activity detection may be performed on more than one audio channel. Only for the purpose of illustration, embodiments where the voice activity detection is performed on multiple audio channels will be described below.

In these embodiments, assume that the voice activity detection is to be performed on a subset of voice channels (denoted as $L_{sub}$) which may comprise some or all the voice channels on the user terminal. The voice activity state in each of the voice channels in the set may be detected. In general, the voice activity may be detected based on a certain feature(s) of the audio signals, for example, including but not limited to short-term energy, zero crossing rate, Cepstra feature, Itakura LPC spectrum distance, and/or periodical measurement of vowels. One or more of such features may be extracted from the audio signal and then compared with a predetermined threshold(s) to determine if the current frame is a voice frame or a noise frame. Any suitable voice activity detection algorithms or processes may be used in connection with embodiments of the present invention.

If a voice activity exists on the jth audio channel, then for the signal frame n, a voice activity state associated with the jth audio channel may be set as $VAD_j(n)=1$, indicating that the current frame is a voice frame. Otherwise, the voice activity state associated with the jth channel is marked as $VAD_j(n)=0$, indicating that the current frame is a noise frame. The current overall voice activity state for the user terminal may be calculated as the sum of VAD(n) of each voice channel in the set $L_{sub}$, which can be expressed as follows:

$$\overline{VAD(n)} = \begin{cases} 1, & \sum_{j=1}^{L_{sub}} VAD_j(n) \geq 1 \\ 0, & \sum_{j=1}^{L_{sub}} VAD_j(n) = 0 \end{cases}$$

It will be appreciated that the voice activity detection is optional. The signal amplitudes for different audio channels may be calculated and compared with each other to determine the functionalities of the associated audio capturing elements, as will be described below at steps S203 and S204, without detecting the voice activities on the audio channels.

Return to FIG. 2, method 200 then proceeds to step S203 where the signal amplitude for the audio channel is calculated by processing the obtained audio signal. As described above with reference to step S103 in FIG. 1, in accordance with embodiments of the present invention, the signal amplitude for the audio channel may comprise any information indicating the magnitude of the audio signals on that channel, including but not limited to the spectrum amplitude, the power spectrum, or any other information (either in time domain or in frequency domain) of the obtained audio signal. In the embodiments shown in FIG. 2, only for the purpose of illustration, the power spectrum will be described as the signal amplitude.

In order to calculate the power spectrum of the obtained audio signal, in some exemplary embodiments, the obtained audio signal may be processed on a frame-by-frame basis. Windowing operation may be applied to each frame of the audio signal, and the windowed signal is subjected to discrete Fourier transform to obtain the spectrum of the frame which may be indicated as $X_j(n,k)$ wherein n is the sequence number of the frame, k indicates the serial number of the frequency point after the discrete Fourier Transformation. In some exemplary embodiments, $X_j(n,k)$ may be calculated as follows:

$$X_j(n,k) = \sum_{m=-\infty}^{+\infty} x_j(m)w(nR-m)e^{-i2\pi km/N},$$

wherein R denotes the number of updating samples for the signal, N denotes the number of discrete Fourier transform points, and w(m) denotes a window function. In accordance with embodiments of the present invention, the window function may be any window functions suitable for audio signal processing, such as Hamming window, Hanning window, rectangular window, etc. The frame length may be within the range of 10-40 ms, for example, 20 ms.

In some exemplary embodiments, there may be an overlap between a frame and its preceding frame, and the amount of overlap may be selected according to specific situations. Additionally, the discrete Fourier transform may be implemented through a Fast Fourier Transform (FFT). The FFT may be directly applied to the windowed audio signal. Alternatively, the zero padding may be performed to enhance the frequency resolution and/or to meet the requirement that condition that the length of FFT is a multiple of the power of two. For example, applying the FFT to N points will obtain the spectrum value for N points.

In some exemplary embodiments, the sampling ratio $F_s$ may be 16 kHz, the Hamming window may be selected, the frame length may be 20 ms, and the inter-frame overlap may be 50%. In these embodiments, each frame signal has 320 sampling points in total, and the number of updating samples R=160. By padding zero at the end of the audio signal, totally 512 sampling points may be obtained. As such, the N-point FFT processing (N=512) may obtain 512 frequency points. Based on the spectrum of the frame of the audio signal and the power spectrum of a preceding frame, the power spectrum value of the current frame may be estimated as follows:

$$P_{X_jX_j}(n,k) = \alpha_j \cdot P_{X_jX_j}(n-1,k) + (1-\alpha_j) \cdot |X_j(n,k)|^2$$

where n denotes the sequence number of the current frame, j denotes a sequence number of the audio channel in consideration, $P_{X_jX_j}(n,k)$ denotes the auto-power spectrum of the audio channel of the user terminal, $\alpha_j$ denotes the smoothing factor of the audio channel which could be set within the range of 0 to 1, and |.| denotes a mod operation.

It will be understood that the above description is just exemplary embodiments of calculating the power spectrum as the signal amplitude for the audio channel. Any other suitable processes or algorithms, whether currently known or developed in the future, may be used in connection to embodiments of the present invention to calculate the power spectrum of audio signals. Moreover, as described above, other information may be used to indicate the signal amplitude of an audio channel.

Furthermore, the user terminal may have a primary audio capturing element, and the audio channel associated with this primary audio capturing element may be referred to as primary audio channel (denoted as $j_m$, for example). In these embodiments, at step S203, for any given audio channel of the user terminal, the relative signal amplitude of that audio channel with respect to the primary audio channel may be calculated, and may be optionally normalized. Such relative signal amplitude indicates the amplitude difference between the primary channel $j_m$ and another audio channel and may be used as the analysis criterion. Still considering the above exemplary embodiments where the power spectrum is used as the signal amplitude, the normalized relative signal amplitude of the channel j and the primary channel $j_m$ may be calculated as follows:

$$\lambda_j(n,k) = \frac{P_{X_j X_j}(n,k) - P_{X_{j_m} X_{j_m}}(n,k)}{P_{X_j X_j}(n,k) + P_{X_{j_m} X_{j_m}}(n,k)}, j = 1, \ldots, L$$

wherein $-1 \leq \lambda_j(n,k) \leq 1$. It can be seen that when $P_{X_j X_j}(n,k)$ is far less than $$P_{X_{j_m} X_{j_m}}(n,k), \lambda_j(n,k) \approx -1;$$

when $P_{X_j X_j}(n,k)$ is far greater than $$P_{X_{j_m} X_{j_m}}(n,k), \lambda_j(n,k) \approx 1;$$

and when $j=j_m$, $\lambda_j(n,k)\approx 0$. The relative signal amplitudes for different audio channels may be compared to make the decision at step S204, as will be detailed below.

Additionally or alternatively, at step S203, the average signal amplitude for an audio channel(s) within a time interval may be calculated. It can be appreciated that the spatial location of the audio source with respect to the user terminal and its audio capturing elements would not probably change a lot within a short time period. Therefore, it is possible to improve the decision accuracy at the following step by detecting and analyzing the channel condition within a certain time interval. Only for the purpose of illustration, in the exemplary embodiments where the voice activity detection is performed and the relative power spectrum value is calculated as the signal amplitude, the average signal amplitude for an audio channel j may be calculated as follows:

$$\overline{\lambda_j}(t) = \sum_{n \in T_{VAD}} \sum_{k=k_1}^{k_2} \lambda_j(n,k)$$

wherein T denotes the length of time interval which may has a range of 1~10 s and typically 2 s in some exemplary embodiments, $n \in T_{VAD}$ denotes each frame having a voice activity within the time interval T, and $k_1$ and $k_2$ are the upper and lower thresholds of a frequency band, respectively. The frequency band may be the one where voice energy is mainly concentrated. For example, if the sampling rate $F_S=16$ kHz and the number of FFT points N=512, then the frequency band may be 200-3500 Hz. Accordingly, $$k_1 = \text{floor}\left(\frac{200}{F_S/N}\right) = 6 \text{ and } k_2 = \text{floor}\left(\frac{3500}{F_S/N}\right) = 112.$$

It will be understood that the above exemplary embodiments, either considered alone or in combination, should be not constructed as limitations of the present invention. Any information capable of indicating the signal amplitude for the audio channel and any combination thereof may be calculated at step S203.

Next, method 200 proceeds to step S204, where the functionalities of the audio capturing elements may be determined based on the signal amplitude for the current audio channel and a further signal amplitude for one or more other audio channels of the user terminal. Generally speaking, the functionalities of the audio capturing elements are determined based on their audio capturing capabilities in the specific situation. The audio capturing elements with higher capability in the current situation will play a major role in audio capturing.

For example, in the embodiments where the average relative power spectrum values within the time interval T are calculated for one or more audio channels, these values may be ranked in a descending order $$\text{sort}_j \overline{\lambda_j}(t) = \{\overline{\lambda_{a_1}}, \overline{\lambda_{a_2}}, \ldots, \overline{\lambda_{a_L}}\},$$

wherein $\{a_1, a_2, \ldots, a_L\}$ is obtained by reordering $\{1, 2, \ldots, j, \ldots L\}$. Then the audio capturing elements associated with the top ranked M audio channels, which are expected to have higher capturing capabilities in the current situation, may be classified into the primary group of audio capturing elements which are used to capture foreground audio signals (e.g., the voice signal from the speaker) in the next time interval. To the contrary, those audio capturing elements associated with lower ranked audio channels may be classified into the auxiliary group of audio capturing elements used to capture background audio signals (e.g., the background noise) in the next time interval. In this way, the functionalities of audio capturing elements on the user terminal may be set adaptively and dynamically according to the current situation.

It will be appreciated that the decision at step S204 is not necessarily based on the average signal amplitude. In some alternative embodiments, the functionality may be determined based on instantaneous state of the audio channels. For example, the calculation of the signal amplitude (step S203) may be performed periodically, and the instantaneous signal amplitudes for different audio channels at the time instant when the calculation is performed may be compared to determine the functionalities of the audio capturing elements.

Figure 3A:
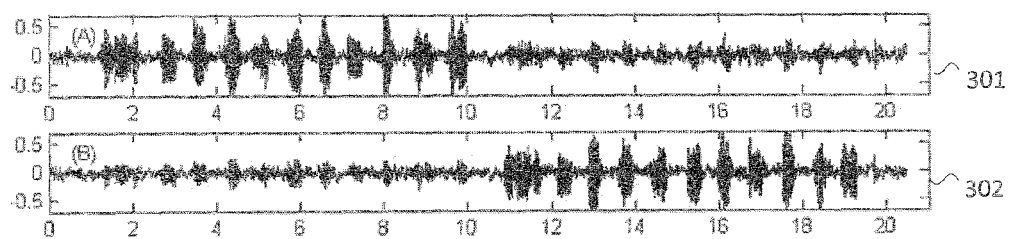
FIGS. 3A and 3B are schematic diagrams illustrating an example of adaptive audio capturing in accordance with an exemplary embodiment of the present invention.

Now consider a specific example of dual-microphone mobile phone. In this example, the mobile phone comprises a first microphone at the lower part of the front face of the phone and a second microphone at the top of the back face as the audio capturing elements. The first and second microphones have associated first and second audio channels, respectively. In the embodiments where the average relative power spectrum values are calculated as the signal amplitude, the sampling rate may be set to be 16 kHz, and the number of sampling point is 16 bit. The audio signals are captured in a large open office, with background noises being surrounded. The speaker first speaks facing the front face of the mobile phone, and then speaks facing the back face of the mobile phone. The time domain signals as captured are shown in FIG. 3A, where the X-axis denotes time and the Y-axis coordinate denotes the signal amplitudes. In FIG. 3A, the signal amplitudes for the first and second microphones are shown by plots 301 and 302, respectively.

Figure 3B:
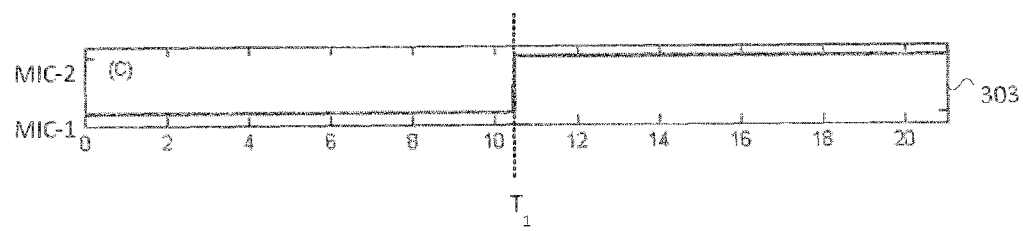

In some exemplary embodiments, the Hamming window is used as the window function, the frame length is 20 ms, the inter-frame overlap is 50%, the zero padding is performed at the end of every frame of the audio signal, and the FFT is performed with N=512 points. Furthermore, the smoothing factor of the power spectrum $a_f$=0.8, frequency thresholds are $k_1$=6 and $k_2$=112, and the length of time interval T is selected as 2 s. The processed results are shown in FIG. 3B. As shown by the plot 303, when the speaker faces the front face of the mobile phone (before the time instant $T_1$ in FIG. 3A), the signal amplitude for the first audio channel is higher than that of the second audio channel. As a result, the associated first microphone (MIC-1) will function as the primary microphone. When the speaker faces the back face of the mobile phone (after the time instant $T_1$ in FIG. 3B), due to the change of signal amplitude for the first and second audio channels, the second microphone (MIC-2) will be changed as the primary microphone while the first microphone will instead function as the auxiliary one.

Figure 4:
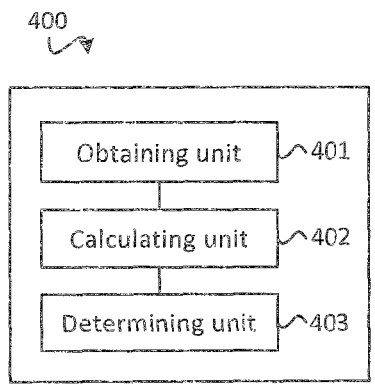
FIG. 4 is a block diagram illustrating an apparatus for adaptive audio capturing in accordance with an exemplary embodiment of the present invention.

Referring to FIG. 4, a block diagram illustrating an apparatus 400 for adaptive audio capturing in accordance with an exemplary embodiment of the present invention is shown. In accordance with embodiments of the present invention, the apparatus 400 may be configured to carry out methods 100 and/or 200 as described above.

As shown, the apparatus 400 comprises an obtaining unit 401 configured to obtain an audio signal through an audio channel associated with an audio capturing element on a user terminal. The apparatus 400 further comprises a calculating unit 402 configured to calculate a signal amplitude for the audio channel by processing the obtained audio signal. In addition, the apparatus 400 comprises a determining unit 403 configured to determine a functionality of the audio capturing element based on the signal amplitude and a further signal amplitude for at least one further audio channel associated with at least one further audio capturing element on the user terminal.

In some exemplary embodiments, the apparatus 400 may further comprise: a voice activity detecting unit configured to detect whether a voice activity exists on one or more audio channels of the user terminal, wherein the determining unit is configured to determine the functionality of the audio capturing element if the voice activity exists on the one or more audio channels.

In some exemplary embodiments, the calculating unit 402 may comprise at least one of: a time domain amplitude calculating unit configured to calculate a time domain amplitude of the obtained audio signal; and a frequency domain amplitude calculating unit configured to calculate a frequency domain amplitude of the obtained audio signal.

In some exemplary embodiments, the calculating unit 402 may comprise an average amplitude calculating unit configured to calculate an average signal amplitude for the audio channel within a time interval. In these embodiments, the further signal amplitude may comprise a further average signal amplitude for the at least one further audio channel within the time interval, and the determining unit 403 may comprise an average amplitude comparing unit configured to compare the average signal amplitude with the further average signal amplitude.

In some exemplary embodiments, the user terminal has a primary audio channel. In these embodiments, the calculating unit 402 may comprise a relative amplitude calculating unit configured to calculate a relative amplitude of the audio channel with respect to the primary audio channel, and the further signal amplitude comprises a further relative amplitude of the at least one further audio channel with respect to the primary audio channel. The determining unit 403 may comprise a relative amplitude comparing unit configured to compare the relative amplitude with the further relative amplitude.

In some exemplary embodiments, the determining unit 403 may comprise a classifying unit configured to classify the audio capturing element into a primary group of audio capturing elements used to capture foreground audio signals or an auxiliary group of audio capturing elements used to capture background audio signals.

It will be understood that various units in the apparatus 400 correspond to the steps of methods 100 and/or 200 described above. As a result, the optional units are not shown in FIG. 4 and the corresponding features are not detailed here.

Figure 5:
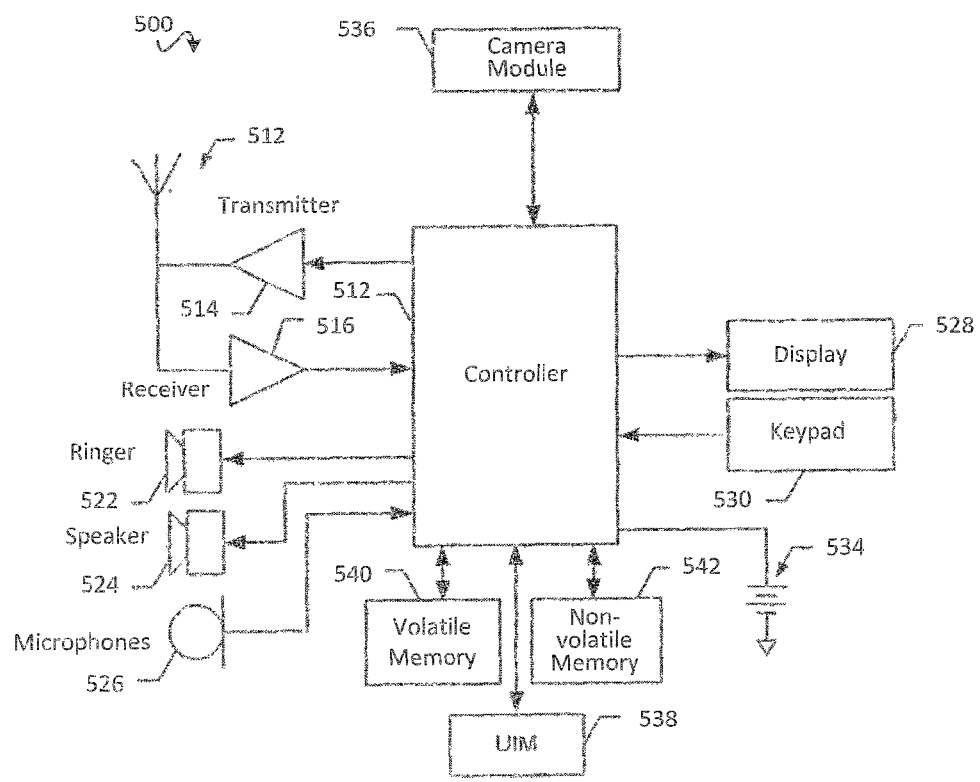
FIG. 5 is a block diagram illustrating a user terminal in accordance with an exemplary embodiment of the present invention.

FIG. 5 is a block diagram illustrating a user terminal in accordance with an exemplary embodiment of the present invention. In some embodiments, the user terminal 500 may be embodied as a mobile phone. It should be understood, however, that a mobile phone is merely illustrative of one type of apparatus that would benefit from embodiments of the present invention and, therefore, should not be taken to limit the scope of embodiments of the present invention.

The user terminal 500 includes an antenna(s) 512 in operable communication with a transmitter 514 and a receiver 516. The user terminal 500 further includes at least one processor or controller 520. For example, the controller 520 may be comprised of a digital signal processor, a microprocessor, and various analog to digital converters, digital to analog converters, and other support circuits. Control and information processing functions of the user terminal 500 are allocated between these devices according to their respective capabilities.

The user terminal 500 also comprises a user interface including output devices such as a ringer 522, an earphone or speaker 524, a plurality of microphones 526 as audio capturing elements and a display 528, and user input devices such as a keyboard 530, a joystick or other user input interface, all of which are coupled to the controller 520. The user terminal 500 further includes a battery 534, such as a vibrating battery pack, for powering various circuits that are required to operate the user terminal 500, as well as optionally providing mechanical vibration as a detectable output.

In some embodiments, the user terminal 500 includes a media capturing element, such as a camera, video and/or audio module, in communication with the controller 520. The media capturing element may be any means for capturing an image, video and/or audio for storage, display or transmission. For example, in an exemplary embodiment in which the media capturing element is a camera module 536, the camera module 536 may include a digital camera capable of forming a digital image file from a captured image.

When embodied as a mobile terminal, the user terminal 500 may further include a universal identity module (UIM) 538. The UIM 538 is typically a memory device having a processor built in. The UIM 538 may include, for example, a subscriber identity module (SIM), a universal integrated circuit card (UICC), a universal subscriber identity module (USIM), a removable user identity module (R-UIM), etc. The UIM 538 typically stores information elements related to a subscriber.

The user terminal 500 may be equipped with at least one memory. For example, the user terminal 500 may include volatile memory 540, such as volatile Random Access Memory (RAM) including a cache area for the temporary storage of data. The user terminal 500 may also include other non-volatile memory 542, which can be embedded and/or may be removable. The non-volatile memory 542 can additionally or alternatively comprise an EEPROM, flash memory or the like. The memories can store any of a number of pieces of information, program, and data, used by the user terminal 500 to implement the functions of the user terminal 500. For example, the memories may store program of computer executable code, which may be configured, with the controller 520, to cause the user terminal 500 to at least perform the steps of methods 100 and/or 200 as described above.

For the purpose of illustrating spirit and principle of the present invention, some specific embodiments thereof have been described above. For a user terminal equipped with a plurality of audio capturing elements, by processing and analyzing the audio signals in real time, the functionalities of the multiple audio capturing elements on a single user terminal may be dynamically determined and changed. For example, according to the various factor like the relative position of the user terminal with respect to the audio signal source and/or the gesture of the user terminal itself, the most optimal audio capturing element may be adaptively determined as the primary element, while one or more other audio capturing elements may function as reference audio capturing elements accordingly. In this way, the quality of captured audio signals may be maintained at a high level in various conditions in use.

In general, the various exemplary embodiments may be implemented in hardware or special purpose circuits, software, logic or any combination thereof. Some aspects may be implemented in hardware, while other aspects may be implemented in firmware or software which may be executed by a controller, microprocessor or other computing device. While various aspects of the exemplary embodiments of the present invention are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

For example, the apparatus 400 described above may be implemented as hardware, software/firmware, or any combination thereof. In some exemplary embodiments, one or more units in the apparatus 400 may be implemented as software modules. Alternatively or additionally, some or all of the units may be implemented using hardware modules like integrated circuits (ICs), application specific integrated circuits (ASICs), system-on-chip (SOCs), field programmable gate arrays (FPGAs), and the like. The scope of the present invention is not limited in that regard. Additionally, various blocks shown in FIGS. 1-2 may be viewed as method steps, and/or as operations that result from operation of computer program code, and/or as a plurality of coupled logic circuit elements constructed to carry out the associated function(s). For example, methods 100 and/or 200 may be implemented by computer program codes contained in a computer program tangibly embodied on a machine readable medium.

In the context of this specification, a machine readable storage medium may be any tangible medium that can contain, or store a program for use by or in connection with an instruction execution system, apparatus, or device. The machine readable medium may be a machine readable signal medium or a machine readable storage medium. A machine readable storage medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Computer program code for carrying out methods of the present invention may be written in any combination of one or more programming languages. These computer program codes may be provided to a processor of a general purpose computer, special purpose computer, or other programmable data processing apparatus, such that the program codes, when executed by the processor of the computer or other programmable data processing apparatus, cause the functions/operations specified in the flowcharts and/or block diagrams to be implemented. The program code may execute entirely on a computer, partly on the computer, as a stand-alone software package, partly on the computer and partly on a remote computer or entirely on the remote computer or server.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Various modifications, adaptations to the foregoing exemplary embodiments of this invention may become apparent to those skilled in the relevant arts in view of the foregoing description, when read in conjunction with the accompanying drawings. Any and all modifications will still fall within the scope of the non-limiting and exemplary embodiments of this invention. Furthermore, other embodiments of the inventions set forth herein will come to mind to one skilled in the art to which these embodiments of the invention pertain having the benefit of the teachings presented in the foregoing descriptions and the drawings.

Therefore, it will be appreciated that the embodiments of the invention are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A method for adaptive audio capturing, the method comprising:
    obtaining an audio signal through an audio channel associated with an audio capturing element on a user terminal;
    detecting whether a voice activity exists on one or more audio channels of the user terminal; and
    if the voice activity exists on the one or more audio channels, determining a functionality of the audio capturing element, which comprises:
    calculating a signal amplitude for the audio channel by processing the obtained audio signal; and
    wherein determining the functionality of the audio capturing element based on the signal amplitude and a further signal amplitude for at least one further audio channel associated with at least one further audio capturing element on the user terminal;
    wherein determining the functionality of the audio capturing element comprises: classifying the audio capturing element into a primary group of audio capturing elements used to capture foreground audio signals or an auxiliary group of audio capturing elements used to capture background audio signals;
    the user terminal has a primary audio channel;
    calculating the signal amplitude comprises calculating a relative amplitude of the audio channel with respect to the primary audio channel and averaging the relative amplitude of the audio channel within a time period to acquire an average relative amplitude of the audio channel;
    the further signal amplitude comprises a further average relative amplitude of the at least one further audio channel with respect to the primary audio channel; and
    determining the functionality of the audio capturing element comprises comparing the average relative amplitude with the further average relative amplitude;
    wherein calculating the relative amplitude of the audio channel with respect to the primary audio channel comprises: acquiring a ratio of a difference between a first intermediate signal amplitude of the audio channel and a second intermediate signal amplitude of the primary audio channel to a summation of the first intermediate signal amplitude and the second intermediate signal amplitude, wherein the first intermediate signal amplitude and the second intermediate signal amplitude are obtained by processing the obtained audio signal.

2. The method according to claim 1, wherein calculating the signal amplitude comprises calculating a time domain amplitude or a frequency domain amplitude by processing the obtained audio signal.

3. The method according to claim 2, wherein the time domain amplitude includes a root-mean-square value; the frequency domain amplitude includes a spectrum amplitude or a power spectrum.

4. The method according to claim 1,
    wherein calculating the signal amplitude comprises calculating an average signal amplitude for the audio channel within a time interval;
    the further signal amplitude comprises a further average signal amplitude for the at least one further audio channel within the time interval; and
    determining the functionality of the audio capturing element comprises comparing the average signal amplitude with the further average signal amplitude.

5. The method according to claim 1,
    wherein
    the further signal amplitude comprises a further relative amplitude of the at least one further audio channel with respect to the primary audio channel; and
    determining the functionality of the audio capturing element comprises comparing the relative amplitude of the audio channel with respect to the primary audio channel with the further relative amplitude.

6. The method according to claim 1,
    wherein averaging the relative amplitude of the audio channel within the time period comprises: summating the relative amplitude of the audio channel over a set of frequencies within the time period.

7. An apparatus for adaptive audio capturing, the apparatus comprising:
    an obtaining unit configured to obtain an audio signal through an audio channel associated with an audio capturing element of the obtaining unit;
    a voice activity detecting unit configured to detect whether a voice activity exists on one or more audio channels associated with the obtaining unit;
    a calculating unit configured to, if the voice activity exists on the one or more audio channels, calculate a signal amplitude for the audio channel by processing the obtained audio signal; and
    a determining unit configured to determine a functionality of the audio capturing element based on the signal amplitude and a further signal amplitude for at least one further audio channel associated with at least one further audio capturing element of the obtaining unit;
    wherein the determining unit comprises: a classifying unit configured to classify the audio capturing element into a primary group of audio capturing elements used to capture foreground audio signals or an auxiliary group of audio capturing elements used to capture background audio signals;
    the apparatus has a primary audio channel;
    the calculating unit comprises a relative amplitude calculating unit configured to calculate a relative amplitude of the audio channel with respect to the primary audio channel; and an averaging unit configured to average the relative amplitude of the audio channel within a time period to acquire an average relative amplitude of the audio channel;
    the further signal amplitude comprises a further average relative amplitude of the at least one further audio channel with respect to the primary audio channel; and
    the determining unit comprises an average relative amplitude comparing unit configured to compare the average relative amplitude with the further average relative amplitude;

wherein the relative amplitude calculating unit calculating the relative amplitude comprises acquiring a ratio of a difference between a first intermediate signal amplitude of the audio channel and a second intermediate signal amplitude of the primary audio channel to a summation of the first intermediate signal amplitude and the second intermediate signal amplitude, wherein the first intermediate signal amplitude and the second intermediate signal amplitude are obtained by processing the obtained audio signal.

8. The apparatus according to claim 7, wherein the calculating unit comprises at least one of:

a time domain amplitude calculating unit configured to calculate a time domain amplitude by processing the obtained audio signal; and a frequency domain amplitude calculating unit configured to calculate a frequency domain amplitude by processing the obtained audio signal.

9. The apparatus according to claim 8, wherein the time domain amplitude includes a root-mean-square value; the frequency domain amplitude includes a spectrum amplitude or a power spectrum.

10. The apparatus according to claim 7, wherein the calculating unit comprises an average amplitude calculating unit configured to calculate an average signal amplitude for the audio channel within a time interval;

the further signal amplitude comprises a further average signal amplitude for the at least one further audio channel within the time interval; and the determining unit comprises an average amplitude comparing unit configured to compare the average signal amplitude with the further average signal amplitude.

11. The apparatus according to claim 7, wherein the further signal amplitude comprises a further relative amplitude of the at least one further audio channel with respect to the primary audio channel; and the determining unit comprises a relative amplitude comparing unit configured to compare the relative amplitude of the audio channel with respect to the primary audio channel with the further relative amplitude.

12. The apparatus according to claim 7, wherein the averaging unit is configured to summate the relative amplitude of the audio channel over a set of frequencies within the time period.

* * * * *